US006501279B1

(12) United States Patent
Fujita et al.

(10) Patent No.: US 6,501,279 B1
(45) Date of Patent: Dec. 31, 2002

(54) ELECTRICAL CONNECTION BOX, A POSITIONING METHOD AND A TESTING DEVICE FOR THE SAME

(75) Inventors: Takao Fujita, Yokkaichi (JP); Hajime Kato, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 09/421,685

(22) Filed: Oct. 20, 1999

(30) Foreign Application Priority Data

Oct. 20, 1998 (JP) ........................................ 10-298810
Oct. 20, 1998 (JP) ........................................ 10-298811

(51) Int. Cl.[7] ........................ H01H 31/04; G01R 31/02; H01R 13/627

(52) U.S. Cl. ........................ 324/538; 324/757; 439/355

(58) Field of Search ................................ 324/538, 754, 324/758, 757, 761; 439/345, 540.1, 296, 355

(56) References Cited

U.S. PATENT DOCUMENTS 4,771,234 A 9/1988 Cook et al.
5,455,515 A * 10/1995 Saijo et al. ................ 324/538
5,811,981 A 9/1998 Tan
5,831,438 A 11/1998 Okura
6,123,564 A * 9/2000 Belmore, III ............... 324/538
6,124,716 A * 9/2000 Kanamori .................. 324/538

FOREIGN PATENT DOCUMENTS

EP 0 351 174 1/1990
EP 0 621 483 10/1994

* cited by examiner

*Primary Examiner*—N. Le
*Assistant Examiner*—Anjan K. Deb
(74) *Attorney, Agent, or Firm*—Anthony J. Casella; Gerald E. Hespos

(57) ABSTRACT

A testing device is provided to position connection parts easily and precisely with respect to probes. A box (1*a*) of an electrical connection box (1) is restrained from twisting by rods (15). Connecting parts T of the electrical connection box (1) then are engaged with probes of a testing device (10). Preferably, one holder (22) is provided for each block. The holder (22) holds the probe so that the probe is displaceable with respect to a retainer (11). The holder (22) is provided with projections used for the positioning.

9 Claims, 12 Drawing Sheets

ELECTRICAL CONNECTION BOX, A POSITIONING METHOD AND A TESTING DEVICE FOR THE SAME

BACKGROUND OF THE INVENTION

1. Field of the Invention

The present invention relates to an electrical connection box, a positioning method and a testing device for the same.

2. Description of the Related Art

A complicated electrical wiring system, such as a wiring harness, may be used with relay boxes, fuse boxes and/or electrical connection boxes. The prior art boxes include casings that have integral or unitarily formed connector portions. Connection circuits that have a multi-layer construction are in the casing and are used to collect and arrange relays, blade type fuses, and/or connectors of the electrical wiring system in one location.

For example, a prior art relay box is formed from resin and has a connector mount portion for a connector of a wiring harness. A fuse connecting portion to be connected with a blade type fuse and a relay connecting portion to be connected with a relay also may be formed on the prior art relay box to conform to the requirements of the wiring harness to be produced. The relay box is assembled into its final mode by connecting the connector with the connector mount portion and the blade type fuse with the fuse connecting portion.

The wiring harness production process includes an electrical conduction test for testing the wiring and the connection. A test for checking whether the connector is present and whether or not the connector is properly connected also are made to assure quality. If a relay box is connected, an electrical conduction test for the relay box is made.

The aforementioned prior art electrical connection box has a multitude of blocks, including the connector mount portion, the fuse connecting portion and the relay connecting portion that are integrated in a complicated layout. As a result, connection parts mounted in the individual blocks cannot be positioned easily with respect to testing parts (e.g. probe pins) for testing the connection parts. This results in poor operability and makes testing errors likely.

Moreover, a corresponding number of testing units need to be prepared for connection parts (terminals of connectors, etc.) to be mounted in the individual connecting portions. Thus, the respective testing units cannot be integrated because the maintenance of the individual testing units is, otherwise, too cumbersome.

As a result, the respective testing units are separated and the electrical conduction test for the electrical connection box is made in each testing unit. This requires time and labor for the testing.

The present invention was developed in view of the above problems, and an object thereof is to provide an integral electrical connection box which can be positioned easily and precisely, and a positioning method and a testing device for such an electrical connection box, wherein the testing device can particularly be easily maintained.

SUMMARY OF THE INVENTION

According to the invention, there is provided a method for positioning an electrical connection box with respect to a testing device when the electrical connection box is tested. The electrical connection box has blocks accommodating connection parts that are integrated in a box. The method is characterized by engaging the connection parts of the electrical connection box with probes of the testing device after restraining the box from twisting by a restraining or correcting member. Accordingly, the orientation of the box and a strain thereof during the molding can be corrected in a specified manner by the correcting member. As a result, the connection parts of the electrical connection box can be engaged with the probes easily and precisely.

According to the invention, there is further provided a device for testing an electrical connection box in which blocks accommodating connection parts are integrated in a box. The testing device comprises one or more probes for testing the connection parts of the blocks. At least one retainer is provided for retaining the probes, and at least one restraining or correcting member provided on the retainer for restraining the box from twisting. Accordingly, the orientation of the box and a strain thereof during the molding can be corrected in a specified manner by the correcting member. As a result, the connection parts of the electrical connection box can be engaged easily and precisely with the probes.

Preferably, the correcting member comprises three rods insertable through the box. Accordingly, since the rods are inserted through the box to correct the orientation of the box, the correction can be securely made by a very simple construction.

According to the invention, there is further provided a testing device for testing an electrical connection box in which blocks accommodating connection parts are integrated in a box. The testing device comprises, one or more probes for testing the connection parts of the blocks, one or more holders provided at least one for each block for holding the corresponding probes, and a retainer for individually detachably retaining the respective holders such that the probes are arranged in a layout corresponding to the blocks. Accordingly, since the probes corresponding to the blocks accommodating the connection parts are retained by the retainer via the holders when the connection parts of the electrical connection box are tested, the holders can be mounted detachably on the retainer. As a result, maintenance can be made individually for the respective probes by mounting and detaching the holder on and from the retainer for each probe, and the testing device capable of testing a plurality of connection parts at once can be constructed.

Preferably, each holder comprises at least one fixed portion to be fixed to the retainer, at least one movable portion displaceable with respect to the fixed portion, and at least one coupling portion for elastically coupling the fixed portion with the movable portion. The probe is provided on the movable portion. Accordingly, the fixed portion to be fixed to the retainer and the movable portion displaceable with respect to the fixed portion are elastically coupled by the coupling portion to make the holder detachably mountable on the retainer. Accordingly, the movable portion can hold the probe while being elastically displaceable. As a result, the probes can elastically take up displacements and dimensional variations when being connected with the connection parts of the electrical connection box.

Further preferably, each holder is formed with an opening portion for opening connecting portions of the lead wires of the probes. Accordingly, the connection of the lead wires of the probes and the mounting of armoring parts on the lead wires can be performed through the opening portion.

Preferably, the coupling portion is a coil spring into which the lead wires are introduced. Accordingly, the lead wires of the probes are free from entanglement and loosening since they are introduced into the coil spring.

According to a further preferred embodiment, there is provided a device for testing an electrical connection box in which blocks accommodating connection parts are integrated in a box. The device comprises probes for testing the connection parts of the blocks. Holders are provided, one for each block, for holding the corresponding probes. A retainer is provided for retaining the respective holders such that the probes are arranged in a layout corresponding to the blocks. Each holder comprises a fixed portion to be fixed to the retainer, a movable portion displaceable with respect to the fixed portion and having the corresponding probe mounted thereon, and a coupling portion for elastically coupling the fixed portion with the movable portion. The coupling portion preferably urges or biases the movable and fixed portions away from each other.

Accordingly, since each holder comprises the fixed portion to be fixed to the retainer, the movable portion displaceable with respect to the fixed portion and having the corresponding probe mounted thereon, and the coupling portion for elastically coupling or connecting the fixed portion with the movable portion, the movable portion can elastically and displaceably hold the probe. As a result, the probes can elastically take up displacements when being connected with the connection parts of the electrical connection box.

Preferably, the movable portion of each holder holds a plurality of probes such that the probes are individually relatively displaceable. Accordingly, the probes are individually displaceably held when the plurality of probes are mounted on the movable portion in accordance with the arrangement of the connection parts. Therefore, displacements can be taken up more minutely.

More preferably, each movable portion further comprises at least one guide projection for guiding the probe to the corresponding connection part by being brought into sliding contact with an outer wall of the corresponding block. Accordingly, since the block and the movable portion are positioned by the guide projection, the probes and the connection parts can be more easily and precisely positioned.

Further preferably, there are provided one or more checking projections which are provided integrally with the probes held by the movable portion to check whether locking portions satisfactorily lock the corresponding connection parts. Each coupling portion couples the corresponding movable portion such that the movable portion can be retracted with respect to the retainer in a direction opposite from the locking portion when the corresponding checking projection is in contact with the locking portion experiencing a locking error. Accordingly, the locking state of the locking portion for the connection part can also be checked when the connection part is tested by the probe.

Most preferably, the movable portion and/or the holders are retained or retainable in the block with a clearance or play so as to be slightly movable in a lateral direction thereof and/or to be slightly rotatable along a longitudinal axis thereof.

According to the invention, there is still further provided an electrical connection box, comprising a plurality of blocks accommodating connection parts, a box in which the respective blocks are integrated in a predetermined layout, and at least one hollow portion formed in the box for permitting a correcting member for correcting the twist of the box to be inserted therethrough. Accordingly, the strain and orientation of the box can be properly corrected during the testing by inserting the correcting member of the testing device through the hollow portion.

These and other objects, features and advantages of the present invention will become more apparent upon a reading of the following detailed description and accompanying drawings.

DETAILED DESCRIPTION OF THE PREFERRED EMBODIMENTS

Figure 1:
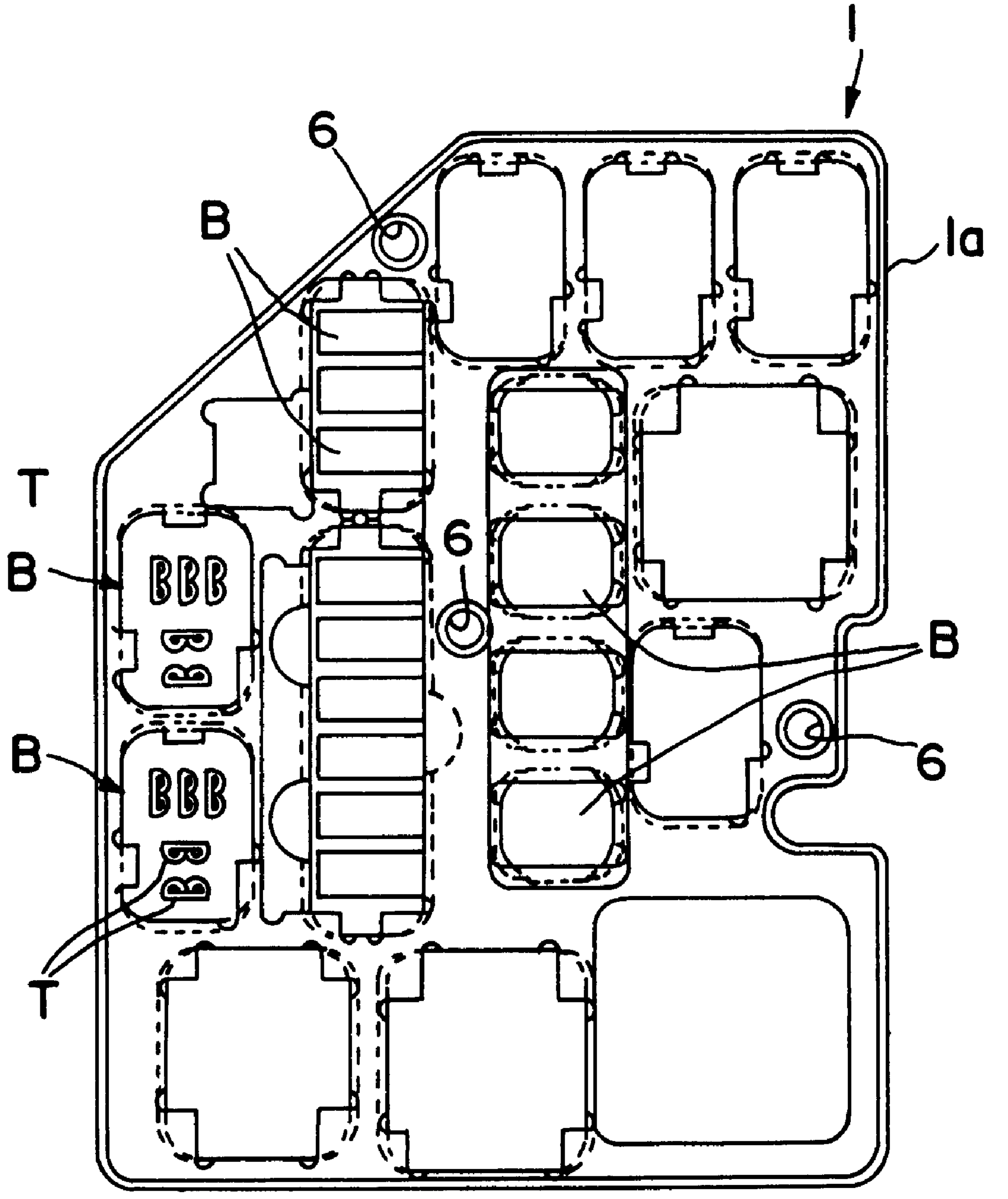
FIG. 1 is a schematic bottom view of an electrical connection box according to the invention.
Figure 2:
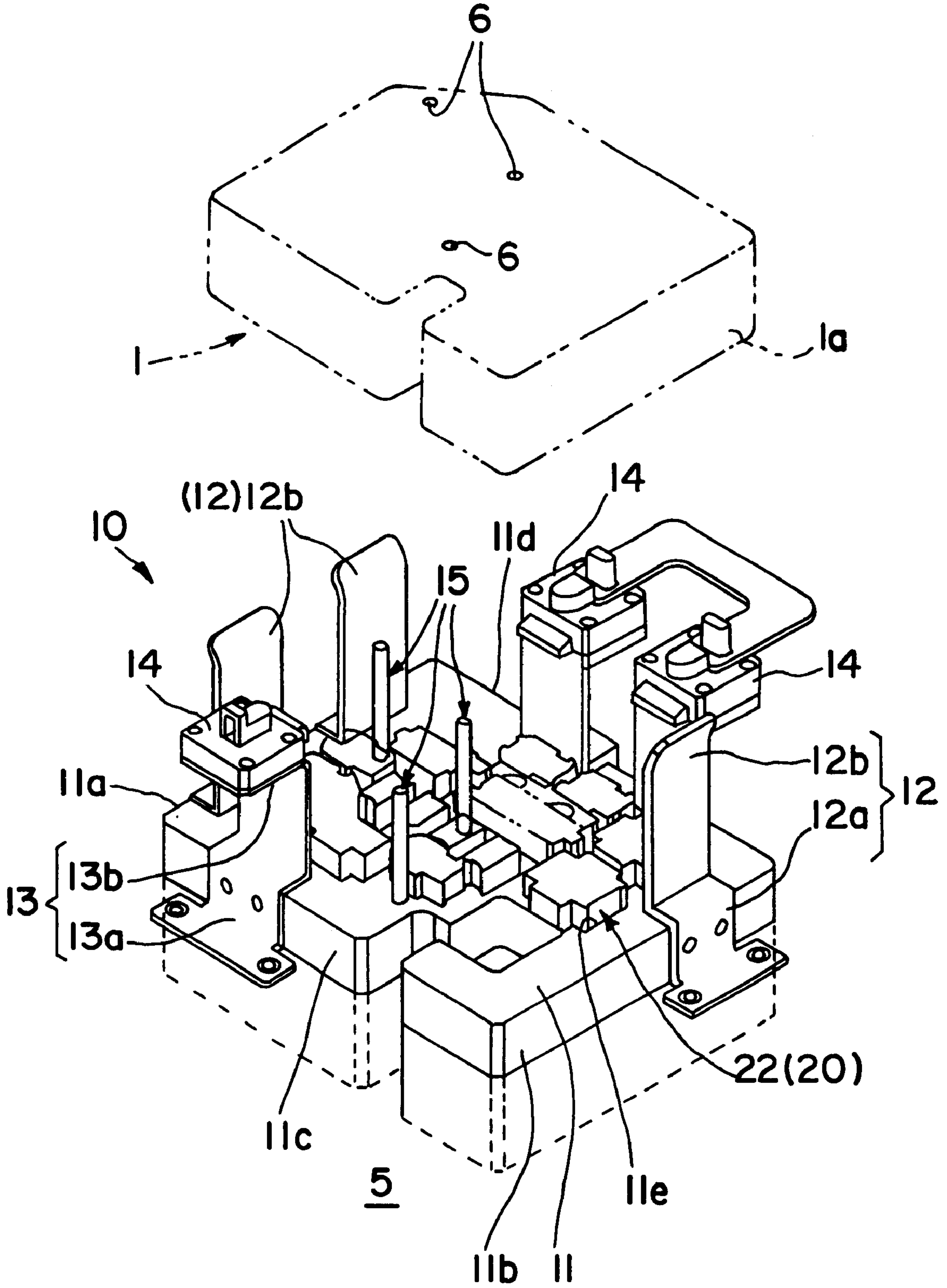
FIG. 2 is a perspective view schematically showing a testing device used to test the electrical connection box of FIG. 1.

With reference to FIGS. 1 and 2, an electrical connection box 1 is tested by a testing device 10. According to this embodiment the electrical connection box 1 has a box main body 1*a* with a substantially rectangular outer configuration having one corner bevelled when viewed from above. In the following "upper" and "upward" refer to a side and to a direction, respectively, of the testing device 10 facing to or to be connected with the electrical connection box 1. A plurality of blocks B are integrated in the box 1*a*. In the illustrated example, the blocks B include a fuse block for mounting blade type fuses, a relay block for mounting relays, and a terminal block into which wires connected with terminals are insertable. These various blocks B are integrated according to the type of the electrical connection box 1. The testing device 10 shown in FIGS. 2 to 10 is constructed for the electrical conduction test of connection parts T (shown only in one position in FIG. 1) to be mounted in the respective blocks B.

With reference to FIG. 2, the testing device 10 includes a retainer 11 substantially corresponding to the box 1*a* of the electrical connection box 1. The retainer 11 is a block-shaped member made, for example, of resin. Fittings 12, which have functions both as a guide and as a mount member, are secured to a pair of substantially parallel side walls 11*a*, 11*b*. Two fittings 12 are secured to the side wall 11*a*, whereas one fitting 12 is secured to the side wall 11*b*.

Each fitting 12 has a stay-shaped mount portion 12*a* and a guide portion 12*b* continuously extending upwardly from the mount portion 12*a*. The retainer 11 is fixed detachably to a work table 5 (see FIG. 3) by the mount portions 12*a* with a lower half thereof preferably imbedded in the work table 5. The guide portions 12*b* project upwardly while the free ends thereof are inclined outwardly. Thus, the box 1*a* of the electrical connection box 1 can be positioned roughly with respect to the retainer 11 by means of the guide portions 12*b*.

Other holding fittings 13 are mounted on the other side walls 11*c*, 11*d* of the retainer 11. Each holding fitting 13 includes a mount portion 13*a* similar to that of the fitting 12 and a locking portion 13*b* formed continuously with the mount portion 13*a* for carrying a locking member 14. The holding fittings 13 are used to mount the retainer 11, and the box 1*a* of the electrical connection box 1 to be joined with the retainer 11, as described later, can be locked by the locking member 14.

Three rods 15 stand on the upper surface of the retainer 11, and the box 1*a* of the electrical connection box is formed with insertion holes 6 into which the respective rods 15 are substantially slidably insertable. The rods 15 construct a correcting member for correcting the orientation and twist of the box 1*a*, and the free ends thereof are located in positions slightly lower than those of the guide portions 12*b* of the fittings 12 (see FIG. 3). By inserting the respective rods 15 into the insertion holes 6 of the box 1*a*, the box 1*a* roughly positioned by the fittings 12 can be positioned more precisely, so that the bottom surface of the box 1*a* can be joined with the upper surface of the retainer 11 in a proper manner.

Figure 3:
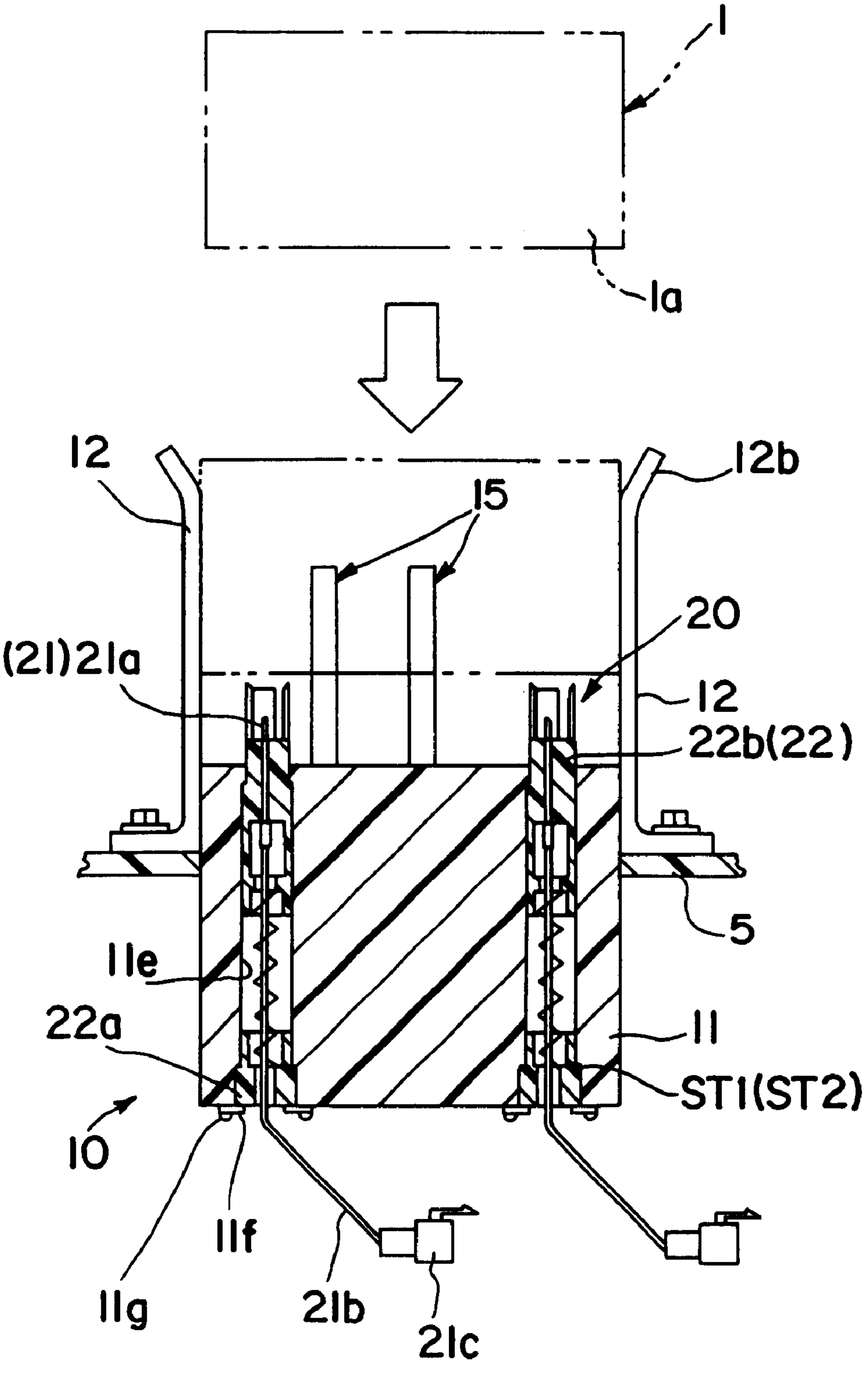
FIG. 3 is a schematic section of the testing device of FIG. 2.

As shown in FIGS. 2 and 3, the retainer 11 is formed with mount holes 11*e* corresponding to the blocks B (see FIG. 1) of the electrical connection box 1 to be tested. Testing units 20 are or can be detachably accommodated in the respectively mount holes 11*e*.

Figure 4:
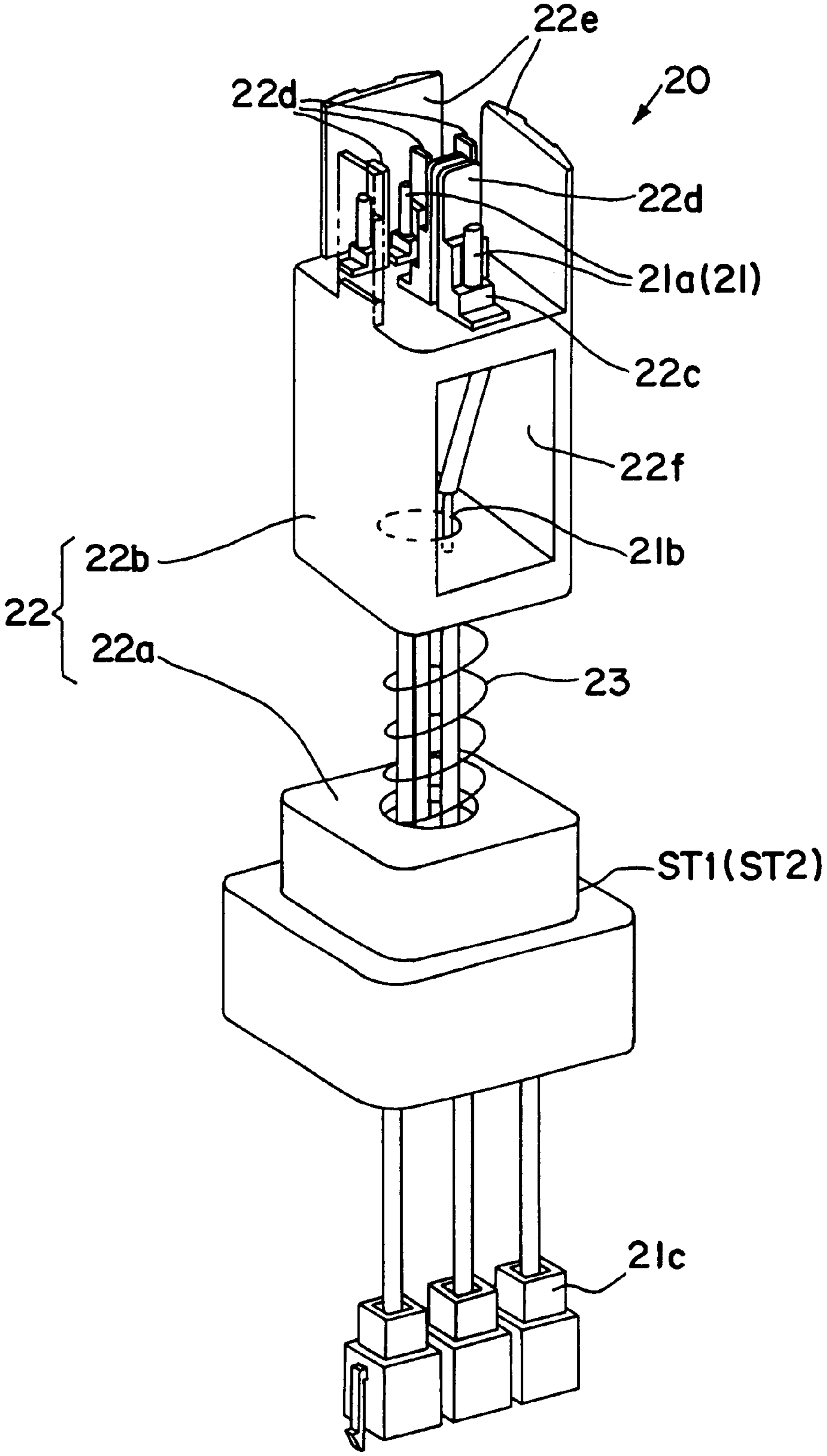
FIG. 4 is a perspective view showing the schematic construction of a testing unit of the testing device of FIG. 2.
Figure 12:
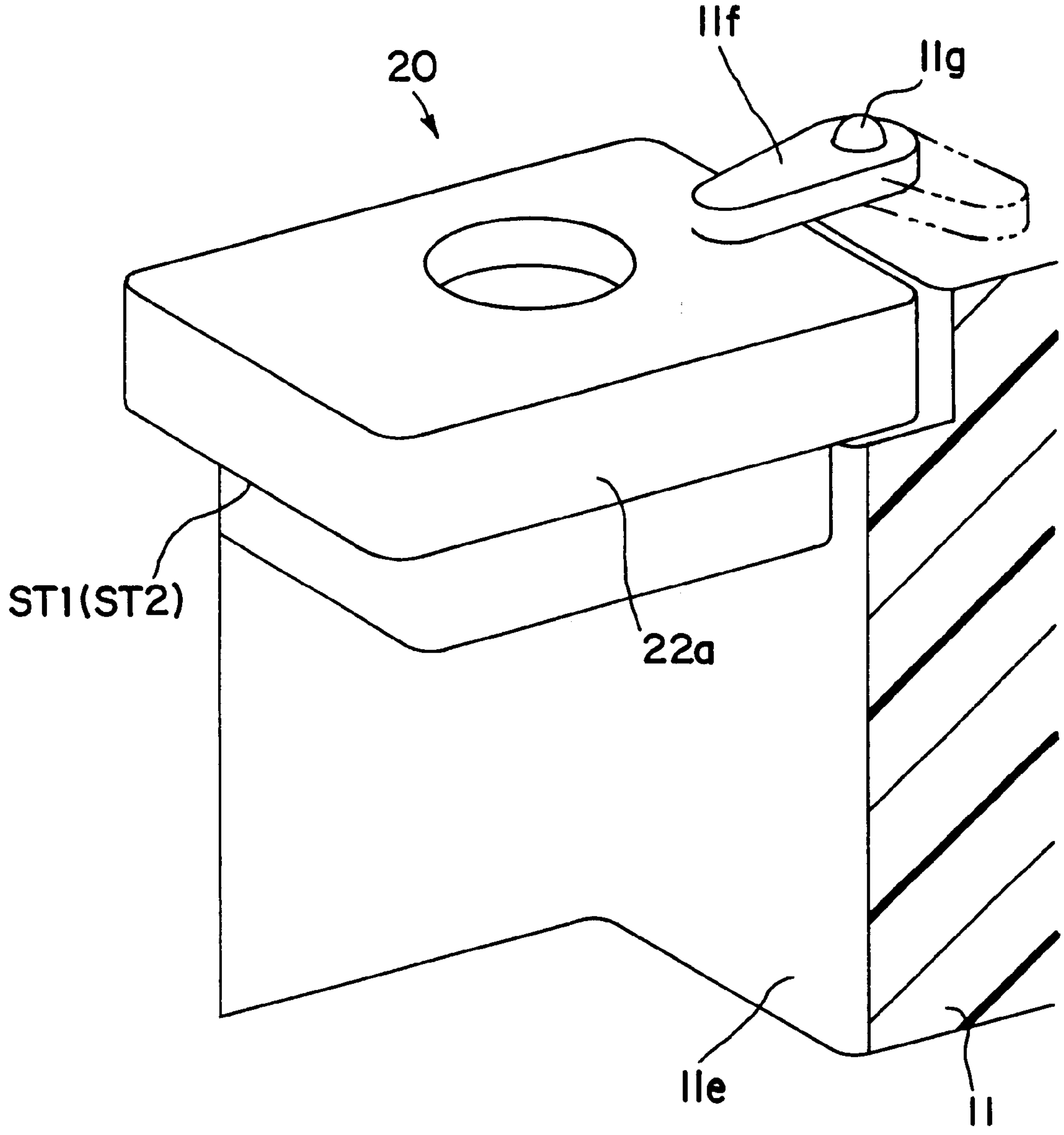
FIG. 12 is a perspective view showing a specific portion of the testing device of FIG. 2 when viewed from below.

FIG. 4 is a perspective view showing the schematic construction of the testing unit 20 used in the testing device 10 of FIG. 2, and FIGS. 5 to 7 are sections showing the testing by the testing unit 20 of FIG. 4. FIG. 12 is a perspective view showing a specific portion when viewed from the bottom of the testing device 10.

With reference to FIGS. 4 to 8 and 12, the testing unit 20 includes probes 21 for testing the connection parts T of the corresponding block B. Each probe 21 conducts an electrical conduction test by being electrically connected with the connection part T, and has pins 21*a* as a contact portion with the connection part T, a lead wire 21*b* connected with the pin 21*a* and a plug 21*c* connected with the bottom end of the lead wire 21*b*.

The probes 21 are held by a holder 22 to couple the probes 21 with the retainer 11. Here, in the illustrated embodiment, the holder 22 is divided into a fixed portion 22*a* to be detachably fixed to the retainer 11 and a movable portion 22*b* which is displaceable with respect to the fixed portion 22*a* and to which the probe pins 21*a* of the probes 21 are fixed. The fixed portion 22*a* and the movable portion 22*b* are elastically coupled by a coil spring 23. The holder 22, in particular its fixed portion 22*a*, may be fixed to the retainer 11 with a clearance or play so that it can be moved slightly in a lateral direction and/or slightly rotated along its longitudinal axis or insertion direction.

Accordingly, in this embodiment, the probes 21 can be held in such a state where the movable portion 22*b* is displaceable by the elastic deformation of the coil spring 23. As a result, the probes 21 can elastically take up displacements when being connected with the connection parts T of the electrical connection box 1.

With reference to FIGS. 3 and 12, the fixed portion 22*a* is formed with a stepped portion ST1 which is widened at the bottom side. The retainer 11, at the bottom of the mount hole 11*e*, is formed with a shoulder portion ST2 that is engageable with the stepped portion ST1. Further, a rotatable claw 11*f* is mounted at the bottom of the retainer 11 for rotation about a screw 11*g*. The rotatable claw 11*f* is displaceable between a holding position and a releasing position. In the holding position, the rotatable claw 11*f* is engaged with the bottom surface of the fixed portion 22*a* that has been inserted into the mount hole 11*e*, such that the stepped portion ST1 of the fixed portion 22*a* is engaged with the shoulder portion ST2 (see FIG. 3) as shown in solid line in FIG. 8. In the releasing position, the rotatable claw 11*f* is retracted from the bottom of the fixed portion 22*a* to permit the holder 22, and accordingly the entire testing unit 20, to be inserted into and withdrawn from the bottom side of the mount hole lie as shown in phantom line in FIG. 8. Thus, the testing units 20 individually and easily are mountable on and detachable from the retainer 11.

The movable portion 22*b* is in the form of a substantially rectangular strut. Raised portions 22*c* for securing the probes 21 stand on the upper end of the movable portion 22*b*. The pins 21*a* of the probes 21 project from these raised portions 22*c*. Further, checking projections 22*d* stand on the raised portions 22*c*. The checking projections 22*d* check locking portions B1 for locking the connection parts T to be tested by the probes 21 in the block B. The checking projections 22*d* are raised to conform to the shape of the locking portions B1 and project slightly more upwardly than the pins 21*a*.

Figure 9:
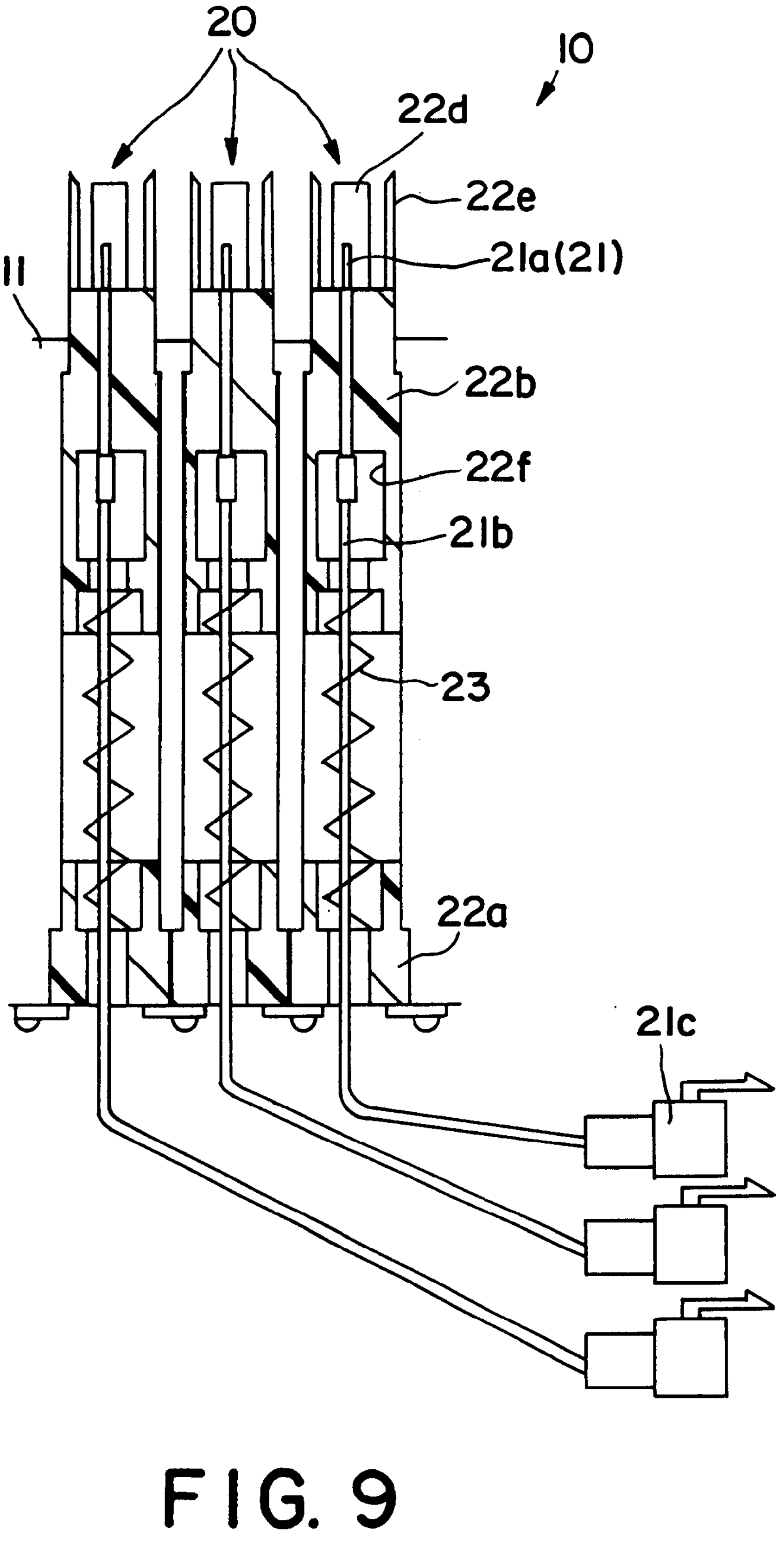
FIG. 9 is a section showing a used state of the testing unit of FIG. 8.
Figure 10:
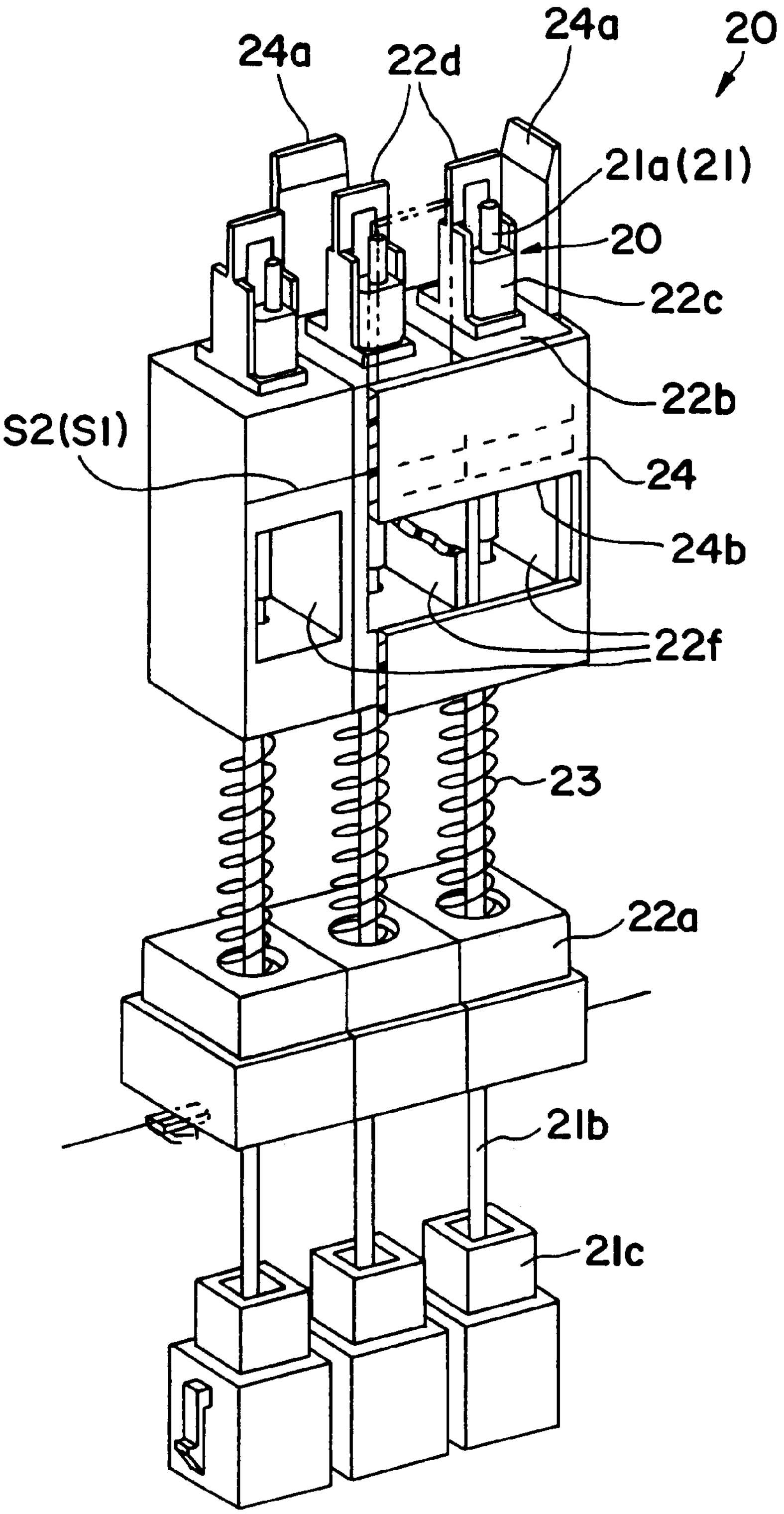
FIG. 10 is a perspective view showing another embodiment of the invention.

Guide projections 22*e* are provided on the movable portion 22*b*, and extend slightly more upwardly than the checking projections 22*d*. When the box 1*a* having its orientation corrected by the aforementioned rods 15 is to be joined, the movable portion 22*b* and the block B are positioned more precisely with respect to each other by the guide projections 22*e* as well as by the elastically displaceable construction of the movable portion 22*b*. Windows 22*f* are formed in the movable portion 22*b*, as shown in FIGS. 4, 9 and 10. The probe pins 21*a* and the lead wires 21*b* are connected and maintained through the windows 22*f*. Specifically, when the probes 21 are mounted on the holder 22, it is necessary to solder the lead wires 21*b* to the probe pins 21*a* after the probe pins 21*a* are mounted on the movable portion 22*b*, and to shift resin sleeves 21*e* fitted around the lead wires 21*b* to cover the soldered portions and thermally shrink the resin sleeves 21*e*. Such a series of operations, or the maintenance of the soldered portions and the like are performed via the windows 22*f*.

The operation of the testing device 10 can be described with reference to FIGS. 2, 3, 5 and 7. With specific reference to FIGS. 2 and 3, the electrical connection box 1 to be tested is placed above the testing device 10 with the bottom surface thereof faced downwardly. The electrical connection box 1 then is lowered while being roughly positioned by the guide portions 12*b* of the fittings 12. The bottom surface of the electrical connection box 1 then is brought into the proximity with the upper surface of the testing device 10 while its sides are guided by the fittings 12 of the testing device 10. The rods 15 are inserted into the insertion holes 6 of the box 1*a* when the electrical connection box 1 has been lowered by a specified distance. As a result, the bottom surface of the electrical connection box 1 is brought even closer to the upper surface of the testing device 10 while having its displacement and twist more precisely corrected.

Figure 5:
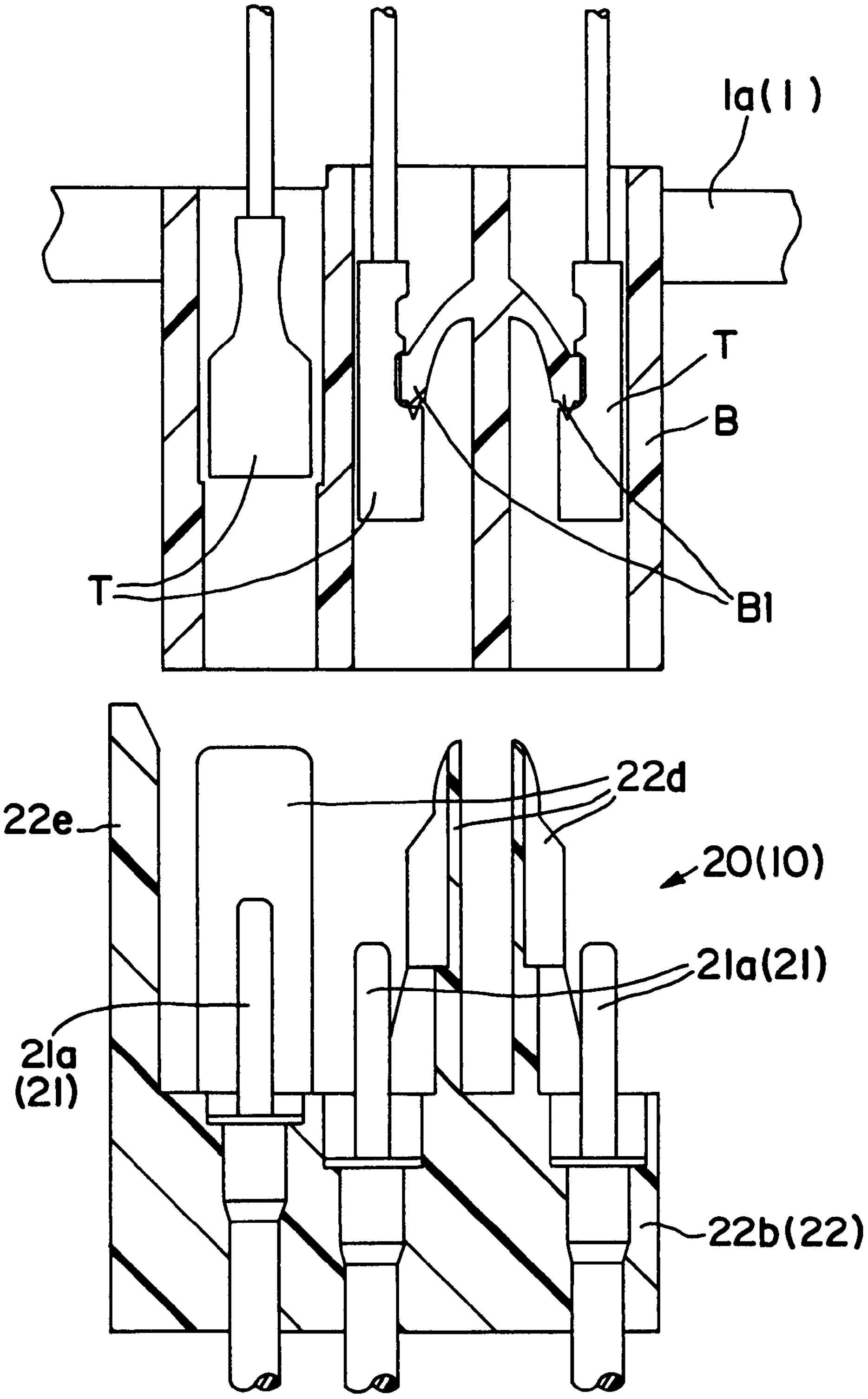
FIGS. 5 to 7 are sections showing the testing by the testing unit of FIG. 4.

With reference to FIG. 5, the box 1*a* of the electrical connection box 1 is guided by the rods 15 toward the upper surface of the testing device 10, and the blocks B to be tested face the holders 22 of the testing units 20 held by the retainer 11 of the testing device 10. The checking projections 22*d* and the probe pins 21*a* project upwardly from the movable portions 22*b* and are introduced into the blocks B while the blocks B have their outer side walls guided by the guide projections 22*e* that are formed on the movable portions 22*b* of the holders 22.

Figure 6:
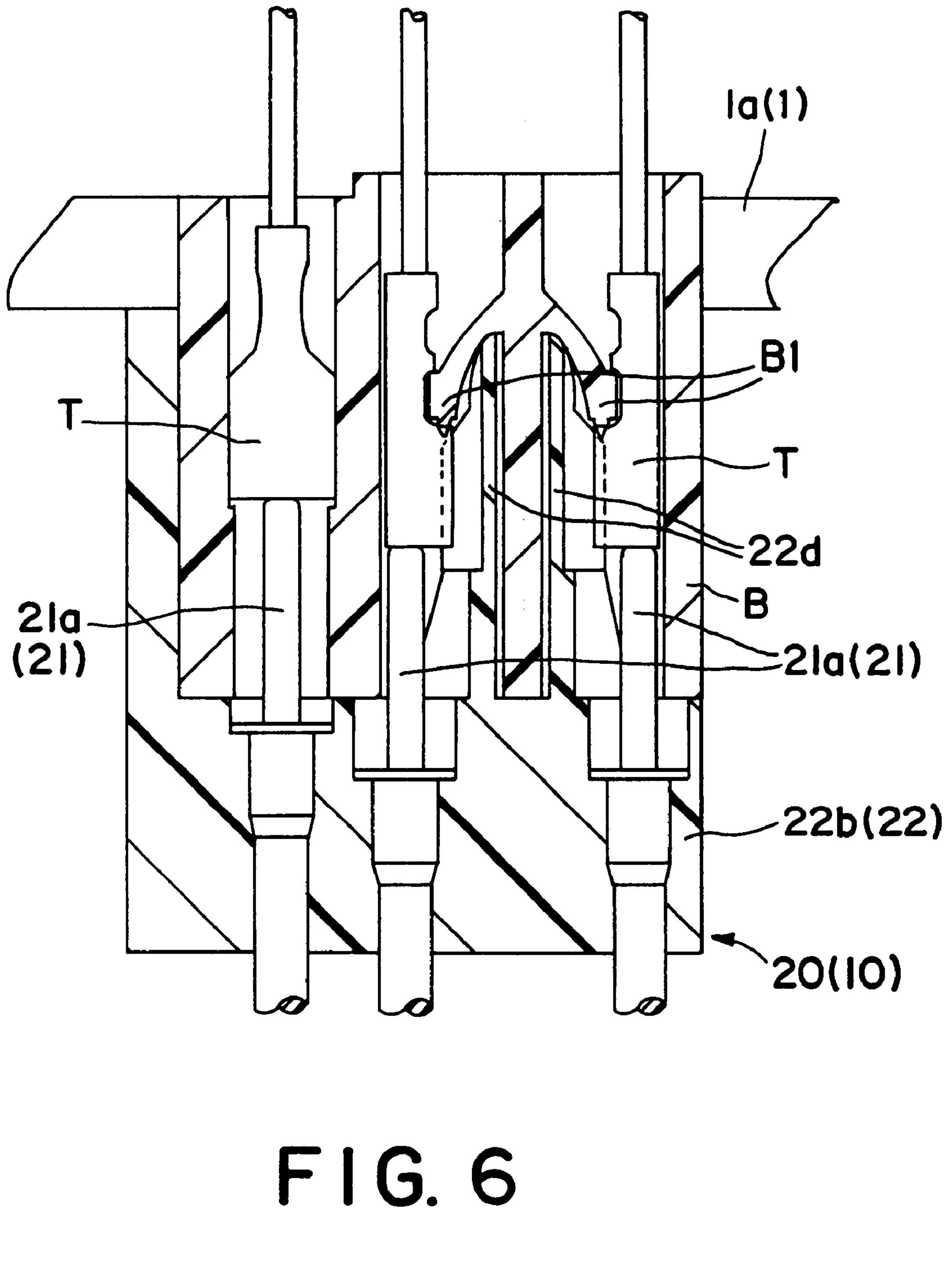

If the connection parts T in the block B are satisfactory, the probe pins 21*a* are connected electrically with the connection parts T with the checking projections 22*d* at least partly inserted into recesses defined by the locking portions B1 as shown in FIG. 6, thereby enabling an electrical conduction test. It should be noted that the locking members 14 described with reference to FIG. 2 lock the box 1*a* and the retainer 11 into each other at this stage, forming the box 1*a* and the retainer 11 into a detachable single unit.

Figure 7:
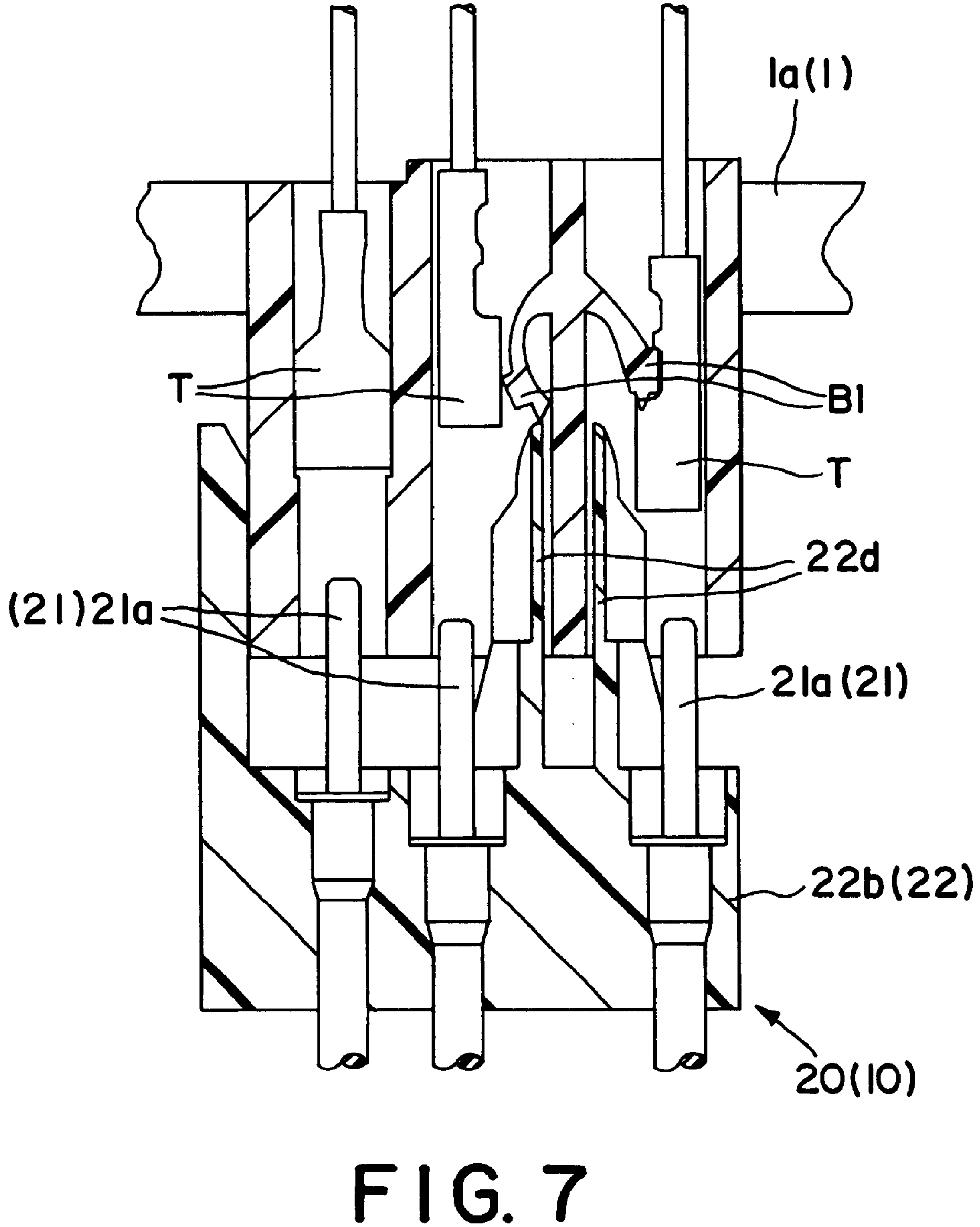

On the other hand, in the case of an error engagement of the locking portion B1 and the connection part T as shown in FIG. 7, the checking projection 22*d* comes into contact with the locking portion B1 corresponding to the unsatisfactorily mounted connection part T. At this moment, the movable portion 22*b* is lowered as a whole, following a downward movement of electrical connection box 1. As a result, the probe pins 21*a* cannot be brought into contact with the connection parts T of the block B that has an erroneous engagement with the locking portion B1. Therefore, the error engagement of the locking portion B1 can be detected.

The aforementioned embodiment is nothing but a preferred specific example of the present invention, and the present invention is not limited thereto.

Figure 8:
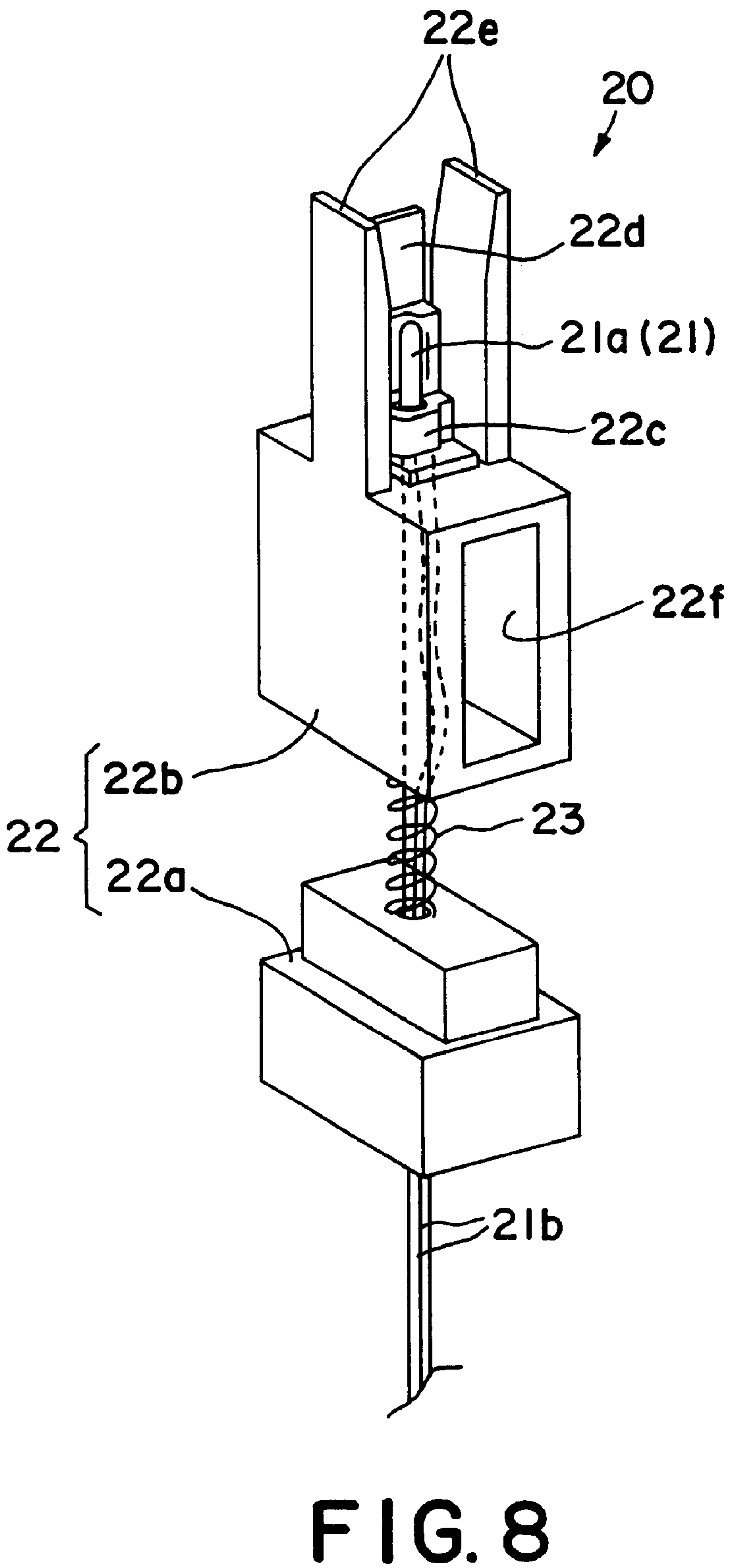
FIG. 8 is a perspective view showing the schematic construction of a testing unit according to another embodiment of the invention.

FIG. 8 is a perspective view showing the schematic construction of a testing unit according to another embodiment of the present invention, and FIG. 9 is a section showing a used state of the testing unit of FIG. 8.

As shown in FIGS. 8 and 9, the testing unit 20 may be made into a unit by providing one probe 21 for one (or a set of) holder(s) 22 and providing the checking projection 22*d* and the guide projections 22*e* necessary for this probe 21.

The, rotatable claw 11*f* shown in FIG. 12 can be displaced from the holding position shown in solid line to the releasing position shown in phantom line, and the testing unit 20 can be withdrawn from the bottom for the maintenance and the exchange of the testing unit 20. Thus, the testing units 20 can be maintained and exchanged individually. This results in an easy individual maintenance of the testing devices 20 and a wider range of application by the exchange of the testing units 20.

As described above, the holders 22 are detachably mountable on the retainer 11 in the aforementioned embodiment. As a result, maintenance can be made for each probe 21 by mounting and detaching the holder 22 on and from the retainer 11 for each probe 21. Therefore, this embodiment has a remarkable effect of providing an integral testing device 10 which can be maintained easily.

Further, to construct the holder 22 that is detachably mountable on the retainer 11, the fixed portion 22*a* of the holder 22 to be fixed to the retainer 11 and the movable portion 22*b* that is relatively displaceable with respect to the fixed portion 22*a* are coupled elastically via the coupling portion (coil spring) 23. Accordingly, when the probes 21 are connected with the connection parts T of the electrical connection box 1, displacements and dimensional variations can be taken up elastically. Therefore, the electrical connection box 1 can be positioned easily and precisely without impairing readiness to maintain even if the electrical connection box 1 to be tested has a box 1*a* with a multitude of blocks B integrated therein.

If the holder 22 is formed with the window 22*f* as an opening, the connection of the probe pins 21*a* of the probes 21 and the lead wires 21*b* and the mounting of armoring parts (resin sleeves) 21*e* on the lead wires 21*b* can be performed through the window 22*f*. This has an advantage of easy production.

Since the lead wires 21*b* of the probes 21 are introduced into the coil spring 23 as the coupling portion, the lead wires 21*b* are free from entanglement and loosening. As a result, the lead wires 21*b* can be handled more easily during the mounting and detachment of the testing unit 20.

The aforementioned embodiment is nothing but a preferable specific example of the present invention, and the present invention is not limited thereto.

Figure 11:
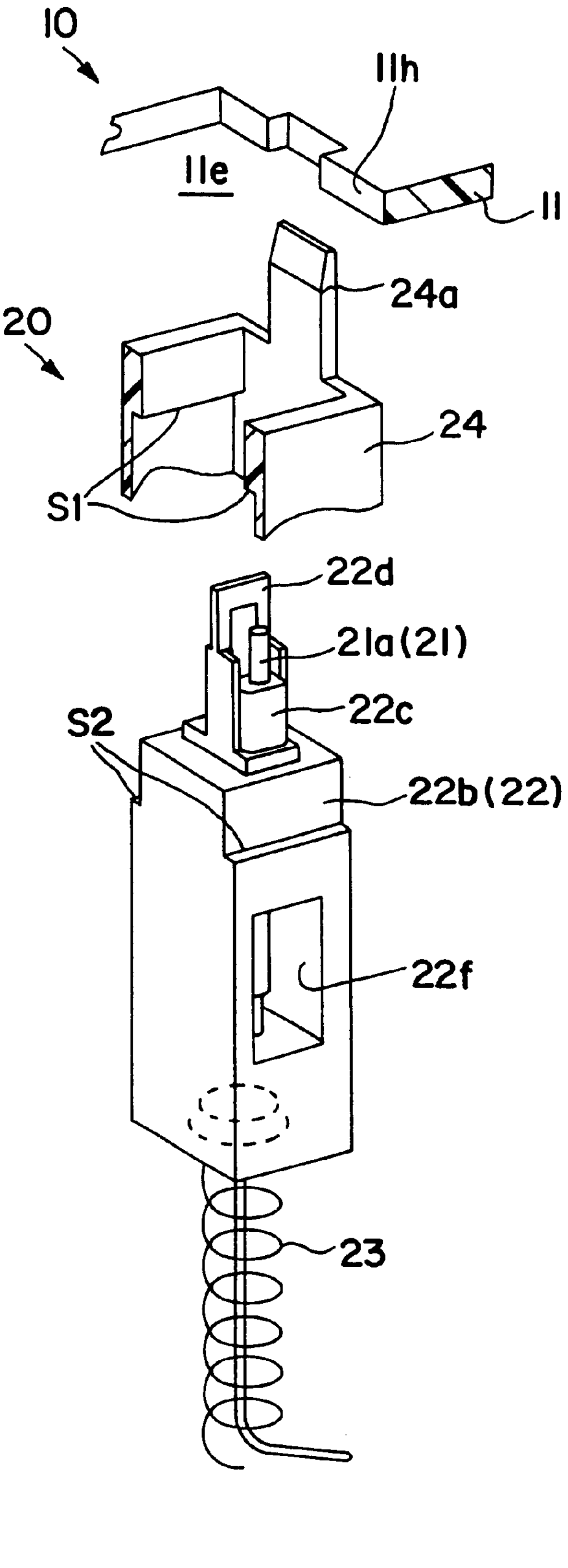
FIG. 11 is an exploded perspective view showing a specific portion of FIG. 10.

With reference to FIGS. 10 and 11, an alternate holder 22 is comprised of a pair of the fixed portion 22*a* and the movable portion 22*b* with one probe 21 and one checking projection 22*d* provided on each movable portion 22*b*. A plurality of holders 22 are provided next to each other, and the movable portions 22*b* thereof are retained by the retainer 11 via a single case 24. The case 24 for the holders 22 corresponds to the block B to be tested, and guide projections 24*a* for guiding outer side walls of the block B project therefrom.

Further, as shown in detail in FIG. 11, the case 24 and the movable portions 22*b* are coupled by step-shaped shoulder portions S1, S2 formed on the case 24 and the movable portions 22*b*, respectively. Thus, the case 24 and the movable portions are engaged so as not to disengage from each other while downward movements of the movable portions 22*b* are permitted. Further, the case 24 and the retainer 11 are engaged so as not to disengage from each other by a receiving portion 11*h* of the retainer 11 for receiving the upper surface of the casing 24 while a downward movement of the case 24 is permitted as those of the movable portions 22*b* are permitted.

As shown in FIGS. 10 and 11, the case 24 is formed with a window 24*b* for opening the windows 22*f*. As described above, according to the aforementioned embodiment, the connection parts T can be positioned with respect to the probes 21 after the orientation and the strain of the box 1*a* of the electrical connection box 1 are corrected. Thus, the electrical connection box 1 can be tested while being easily and precisely positioned, with the result that operability can be improved and an occurrence of a testing error can be prevented.

Further, since the holders 22 hold the probes 21 so that the probes 21 are individually displaceable, displacements can be taken up more precisely to enable more secure positioning.

Particularly, if the movable portion 22*b* is provided with the guide projections 22*e*, the block B and the movable portion 22*b* are positioned more precisely by the guide projections. Therefore, the probes 21 and the connection parts T can be positioned more easily and precisely.

Further, if the movable portion 22*b* is provided with the checking projection 22*d* for checking whether or not the locking portion B1 is satisfactorily locking the connection part T, the locking state of the locking portion B1 for the connection part T also can also be tested when the connection part T is tested by the probe 21. This results in a better convenience.

As described above, the electrical connection box can be tested while being easily and precisely positioned since the connection parts can be positioned with respect to the probes while the orientation and the twist of the box of the electrical connection box are corrected. As a result, operability can be improved and an occurrence of a testing error can be prevented.

Moreover, since the holders hold the probes so that the probes are individually displaceable, displacements can be taken up more precisely to enable more secure positioning.

Particularly, if the movable portion is provided with the guide projections, the block and the movable portion are positioned more precisely by the guide projections. Therefore, the probes and the connection parts can be positioned more easily and precisely.

Further, if the movable portion is provided with the checking projection for checking whether or not the locking portion is satisfactorily locking the connection part, the locking state of the locking portion for the connection part also can be tested when the connection part is tested by the probe. This results in a better convenience.

As described above, the holder is detachably mountable on the retainer. As a result, maintenance can be made for each probe by individually mounting and detaching the holders on and from the retainers for the respective probes. Therefore, there can be obtained a remarkable effect of providing an integral testing device which can be easily maintained.

Further, if the fixed portion of the holder to be fixed to the retainer and the movable portion thereof displaceable with respect to the fixed portion are elastically coupled via the coupling portion in order to construct the holder detachably mountable on the retainer, displacements and dimensional variations can be elastically taken up when the probe is connected with the connection parts of the electrical connection box. Therefore, even in the case that the electrical connection box in which a multitude of blocks are integrated in the box is to be tested, the electrical connection box can be easily and precisely positioned without impairing readiness to maintain.

Particularly, if the holder is formed with the window as an opening portion for opening the connecting portions of the probe pins of the probe and the lead wires, the connection of the probe pins and the lead wires and the mounting of the armoring parts on the lead wires can be performed through the window. This has an advantage of easy production.

Further, if the coupling portion is a coil spring into which the lead wires of the probe are introduced, the lead wires are free from entanglement and loosening. As a result, the lead wires can be more easily handled during the mounting and detachment of the testing unit.

What is claimed is:

1. A testing device for testing an electrical connection box, said electrical connection box comprising a box having a plurality of blocks, each of said blocks having a plurality of connection parts therein, said testing device comprising:

a retainer configured for engagement with the box;

a plurality of holders mounted in the retainer, the plurality of holders corresponding in number respectively to the plurality of blocks, and the holders being disposed in the retainer for alignment with the blocks when the retainer is engaged with the box, each said holder having a fixed portion fixed to the retainer and a movable portion movable relative to the retainer;

elastic couplings for elastically coupling the fixed and movable portions of each said holder and for biasing each said movable portion toward the corresponding block;

a plurality of probes mounted in the movable portion of each of said holders for engagement respectively with the connection parts in the blocks of the electrical connection box for testing the connection parts of the blocks; and a plurality of restraining members projecting substantially rigidly from the retainer distances further than both the holders and the probes and at locations spaced from the holders and the probes for engaging the box at locations spaced from the blocks and spaced from the connection parts and for restraining the box from twisting.

2. A testing device according to claim 1, wherein the restraining member comprises three rods insertable respectively through three hollow portions of the box, the hollow portions being spaced from the blocks and from the connection parts, and each said holder having at least one guide projection formed thereon for guiding engagement with a portion of the corresponding block spaced from any of the connection parts in the block.

3. A testing device according to claim 1, wherein the movable portion of each said holder is formed with an opening extending traverse to the respective probes for accessing connecting portions of lead wires of the probes.

4. A testing device according to claim 3, wherein the couplings comprise coil springs into which all of the lead wires for the respective holder are introduced.

5. A testing device according to claim 3, wherein the movable portion of each holder holds a plurality of probes such that the probes are individually relatively displaceable.

6. A testing device according to claim 1, wherein each movable portion further comprises at least one guide projection for guiding the probe to the corresponding connection part by being brought into sliding contact with the corresponding block.

7. A testing device according to claim 6, further comprising at least one checking projection integrally provided on the movable portion in positions for engaging locking portions that have not satisfactorily locked the corresponding connection parts, wherein the coupling portion couples the corresponding movable portion such that the movable portion can be retracted with respect to the retainer in a direction opposite from the locking portion when the corresponding checking projection is in contact with the locking portion experiencing a locking error.

8. A testing device according to claim 1, wherein the box includes outer peripheral surfaces, and wherein a plurality of the restraining members are disposed to engage the outer peripheral surfaces of the box for preventing the box and the retainer from twisting relative to one another.

9. A testing device for testing an electrical connection box, said electrical connection box comprising a box having a plurality of blocks, each said block having at least one connection part therein, and at least one of said blocks having a plurality of connection parts therein, said testing device comprising:

a retainer configured for engagement with the box, plurality of holders mounted in the retainer, the plurality of holders corresponding in number respectively to the plurality of blocks, and the holders being disposed in the retainer for alignment with the blocks when the retainer is engaged with the box, each said holder having a fixed portion fixed to the retainer and a movable portion movable along a mating direction relative to the retainer, the movable portion of each said holder being formed with a window extending into the movable portion transverse to the mating direction;

elastic couplings for elastically coupling the fixed and movable portions of each said holder and for biasing each said movable portion along the mating direction toward the corresponding block;

at least one probe mounted in the movable portion of each said holder and a plurality of said probes mounted in the movable portion of at least one of said holders for engagement respectively with the connection parts in the blocks of the electrical connection box for testing the connection parts of the blocks; and a plurality of restraining members projecting substantially rigidly from the retainer distances further than both the holders and the probes and at locations spaced from the holders and the probes for engaging the box at locations spaced from the blocks and spaced from the connection parts and for restraining the box from twisting whereby the openings in the movable portions of the holders enable repair and replacement of the probes as needed.

* * * * *